United States Patent
Su et al.

(10) Patent No.: US 9,265,098 B2
(45) Date of Patent: Feb. 16, 2016

(54) IMAGE DISPLAY SYSTEM

(71) Applicants: INNOCOM TECHNOLOGY (SHENZHEN) CO., LTD., Shenzhen (CN); CHIMEI INNOLUX CORPORATION, Chu-Nan (TW)

(72) Inventors: Tsung-Yi Su, Chu-Nan (TW); Du-Zen Peng, Chu-Nan (TW); Hsiang-Lun Hsu, Chu-Nan (TW)

(73) Assignees: INNOCOM TECHNOLOGY (SHENZHEN) CO., LTD. (CN); INNOLUX CORPORATION (TW)

( * ) Notice: Subject to any disclaimer, the term of this patent is extended or adjusted under 35 U.S.C. 154(b) by 210 days.

(21) Appl. No.: 13/706,795

(22) Filed: Dec. 6, 2012

(65) Prior Publication Data

US 2013/0147346 A1    Jun. 13, 2013

(30) Foreign Application Priority Data

Dec. 8, 2011  (TW) .............................. 100145292 A

(51) Int. Cl.
  *H01J 63/04*   (2006.01)
  *H05B 33/04*   (2006.01)
  (Continued)

(52) U.S. Cl.
  CPC ............ *H05B 33/04* (2013.01); *H01L 51/5246* (2013.01); *H01L 51/5284* (2013.01); *H01L 27/322* (2013.01)

(58) Field of Classification Search
  CPC ...................................................... H05B 33/04
  USPC ...................................................... 313/504
  See application file for complete search history.

(56) References Cited

U.S. PATENT DOCUMENTS

2003/0173895 A1  9/2003  Kato et al.
2005/0185006 A1*  8/2005  Miyasaka .......................... 347/9
(Continued)

FOREIGN PATENT DOCUMENTS

CN    101009302    8/2007
KR    10-0810635    3/2008
(Continued)

OTHER PUBLICATIONS

Office Action dated Jul. 7, 2014 from corresponding No. TW 100145292.
(Continued)

*Primary Examiner* — Anh Mai
*Assistant Examiner* — Hana Featherly
(74) *Attorney, Agent, or Firm* — Hauptman Ham, LLP

(57) ABSTRACT

A system for displaying images employing an organic electroluminescent device is provided. The organic electroluminescent device includes a first substrate with an inside surface; an organic electroluminescent pixels array disposed on the inside surface of the first substrate; a second substrate with an inside surface, wherein the inside surface of the second substrate is opposite to the inside surface of the first substrate; a color filter layer disposed on the inside surface of the second substrate; and an opaque frit sealing layer disposed between the first substrate and the second substrate, wherein the opaque frit sealing layer is separated from the organic electroluminescent pixels array by a dummy region and is encapsulating the organic electroluminescent pixel array between the first substrate and second substrate, and wherein the dummy region is filled up with a black matrix material, a frit sealing layer.

20 Claims, 8 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 2007/0170845 A1* | 7/2007 | Choi et al. | 313/504 |
| 2007/0172971 A1* | 7/2007 | Boroson | 438/26 |
| 2010/0133521 A1* | 6/2010 | Shioya et al. | 257/40 |

FOREIGN PATENT DOCUMENTS

| | | |
|---|---|---|
| TW | 200723948 | 6/2007 |
| TW | I297211 | 5/2008 |
| TW | I335680 | 1/2011 |

OTHER PUBLICATIONS

Office Action dated Jan. 16, 2015 from corresponding No. CN 201110405672.7.

* cited by examiner

IMAGE DISPLAY SYSTEM

CROSS REFERENCE TO RELATED APPLICATIONS

This application is based upon and claims the benefit of priority from the prior Taiwan Patent Application No. 100145292, filed on Dec. 08, 2011, the entire contents of which are incorporated herein by reference.

BACKGROUND

1. Technical Field

The present invention relates to an image display system, and in particular relates to an image display system having an organic electroluminescent device.

2. Description of the Related Art

Organic light-emitting diodes (OLED) use an organic electroluminescent layer. The trend in organic electroluminescent display technology is for higher luminescent efficiency and longer lifetime. As a result, an active matrix organic electroluminescent device with thin film transistors has been developed. The active matrix organic electroluminescent device has panel luminescence with thin and lightweight characteristics, spontaneous luminescence with high luminescent efficiency and low driving voltage, and advantages of increased viewing angle, high contrast, high-response speed, and full color. However, since the organic electroluminescent device is easily damaged by ambient humidity and air penetration, the organic electroluminescent device has poor stability in general.

Therefore, in the fabrication of the organic electroluminescent device, a sealing process for protecting the organic electroluminescent pixels array of the organic electroluminescent device from the outside may be performed. For example, a sealant such as an epoxy resin is disposed on the edges of am encapsulating cover for encapsulating the organic electroluminescent device, and the encapsulating cover has a cavity for containing an absorbent. However, since it is not possible to completely prevent moisture and oxygen from permeating from the outside into the organic electroluminescent device by the above-described methods, the organic electroluminescent device may be deteriorated after operating for a period of time.

In order to solve the aforementioned problem, an organic electroluminescent device 10 sealed with a low-melting sealing glass has been disclosed. Please referring to FIG. 1, the organic electroluminescent device 10 has a substrate 12, and an organic electroluminescent pixels array 14 is formed on the substrate 12. A package substrate 16 is disposed opposite to the substrate 12, and a low-melting sealing glass 18 is used to seal the substrate 12 with the package substrate 16, defining a space containing the organic electroluminescent pixels array 14. It should be noted that, since the low-melting sealing glass is cured by a laser curing process, the low-melting sealing glass 18 should be separated with a predetermined distance D from the organic electroluminescent pixels array 14 (forming a gap 15) in order to prevent the organic electroluminescent pixels array 14 from the heat generated during the laser curing process. Further, the organic electroluminescent device 10 must have a polarizing film 12 disposed on the package substrate 16, in order to prevent the reflective ambient light (incident from the gap 15 and passed through the low-melting sealing glass) from degrading the display performance of the organic electroluminescent device 10. However, the additional process for forming the polarizing film results in a longer manufacturing time and higher cost and reduces the yield of the organic electroluminescent device.

Therefore, a novel organic electroluminescent device which overcomes the above problems is desired

SUMMARY

An exemplary embodiment of the invention provides a system for displaying images including an organic electroluminescent device. The organic electroluminescent device includes a first substrate with an inside surface; an organic electroluminescent pixels array disposed on the inside surface of the first substrate; a second substrate with an inside surface, wherein the inside surface of the second substrate is opposite to the inside surface of the first substrate; a color filter layer disposed on the inside surface of the second substrate; and an opaque frit sealing layer disposed between the first substrate and the second substrate for sealing the first substrate and the second substrate, wherein the opaque frit sealing layer is separated from the organic electroluminescent pixels array by a dummy region and is encapsulating the organic electroluminescent pixel array between the first substrate and second substrate, and wherein the dummy region is filled up with a black matrix material, a frit sealing layer, or combinations thereof.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Accordingly, the present invention provides an image display system including an organic electroluminescent device. In particular, the organic electroluminescent device of the present invention can eliminate the polarizing film, thereby reducing manufacturing time for fabrication and cost and increasing the yield. Further, the luminous efficiency of the organic electroluminescent device can also be increased since the emitted light of the organic electroluminescent device does not have to pass through the polarizing film.

The following description is of the best-contemplated mode of carrying out the invention. This description is made for the purpose of illustrating the general principles of the invention and should not be taken in a limiting sense. The scope of the invention is best determined by reference to the appended claims.

Figure 1:
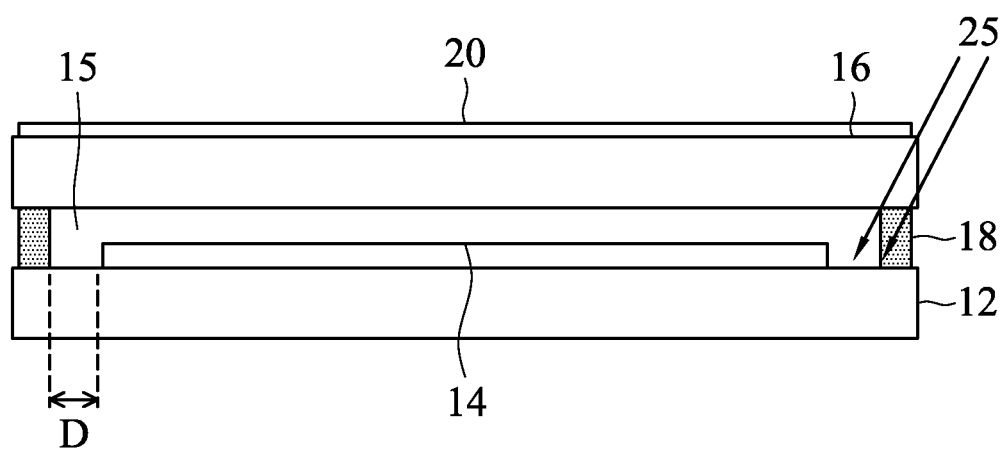
FIG. 1 is a schematic cross section of a conventional organic electroluminescent device.
Figure 2:
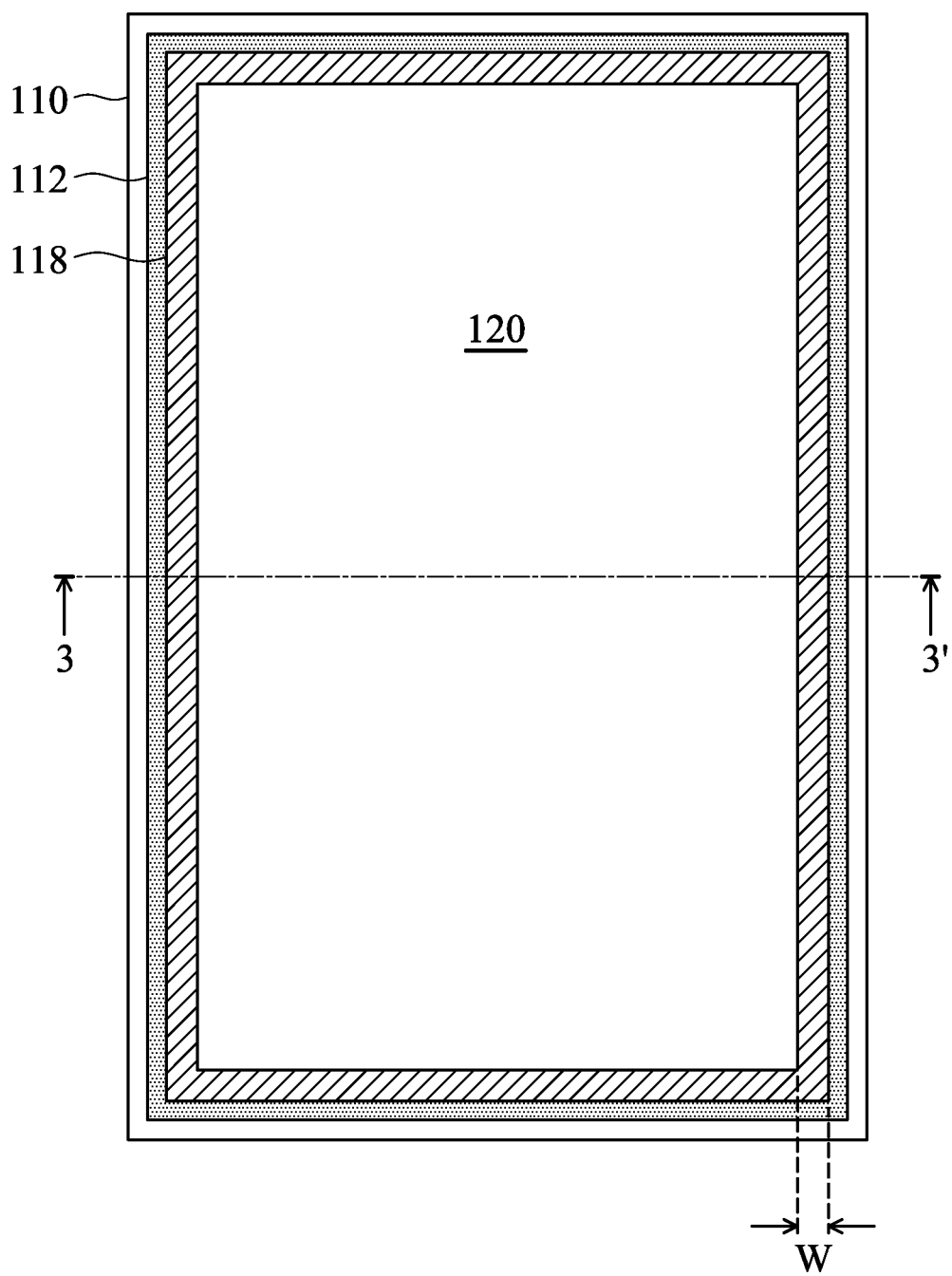
FIG. 2 is a schematic plane view of the organic electroluminescent device according to an embodiment of the present invention.

FIG. 2 shows a schematic plane view of an organic electroluminescent device 100 according to an embodiment of the present invention. The organic electroluminescent device 100 an opaque frit sealing layer 112 and a color filter layer 120 (the color filter layer 120 is disposed over an organic electroluminescent pixels array (not shown)), wherein the opaque frit sealing layer 112 and the color filter layer 120 (and the organic electroluminescent pixels array) are separated by a dummy region 118. The dummy region 118 has a specific width W apart from the organic electroluminescent pixels array in order to prevent the organic electroluminescent pixels array from damaging by the heat generated during a laser curing process of the opaque frit sealing layer 112. Herein, the width W can be between 0.05~0.5 µm, such as 0.1-0.3 µm.

Figure 3:
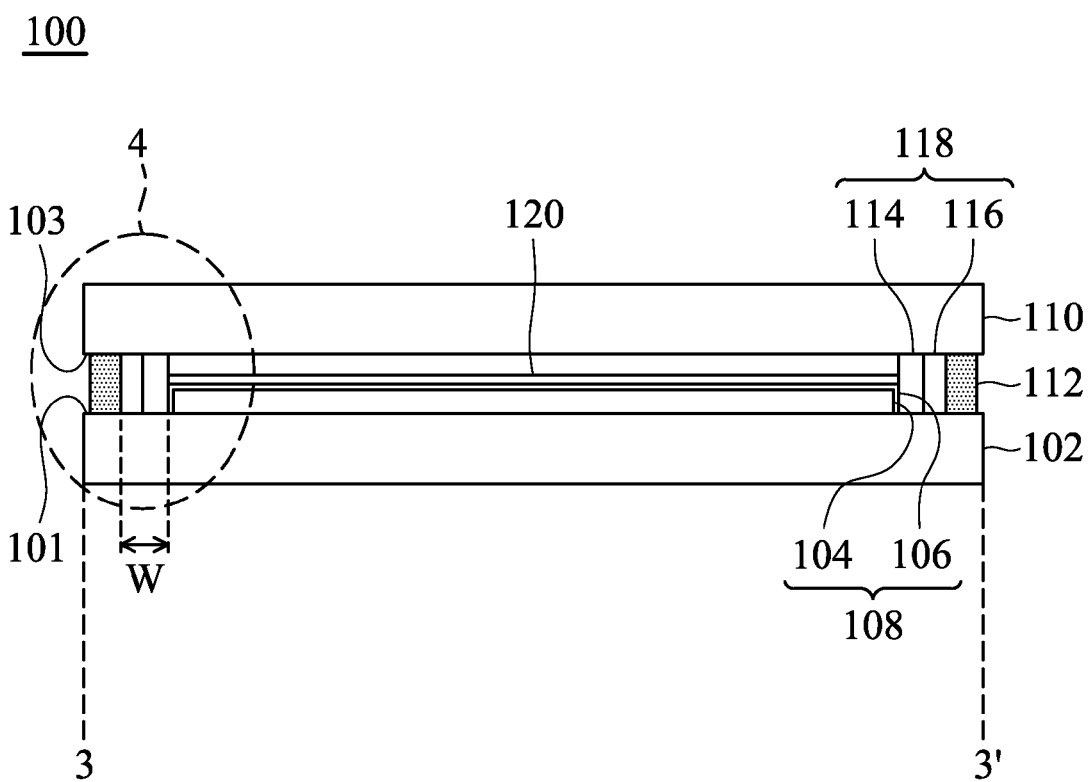
FIG. 3 is a schematic cross section of the organic electroluminescent device shown in FIG. 2 along the line 3-3'.

Please referring to FIG. 3, a cross section of the organic electroluminescent device 100 of FIG. 2 along the line 3-3' is shown. The organic electroluminescent device 100 includes a first substrate 102 (such as a glass substrate), the first substrate 102 has an inside surface 101, and an organic electroluminescent pixels array 108 disposed on the inside surface 101 of the first substrate 102. The organic electroluminescent pixels array 108 can include a plurality of organic electroluminescent pixel elements 104 and a planarization layer 106 covering the organic electroluminescent pixel elements 104. The organic electroluminescent pixel element 104 can be a top-emission white organic electroluminescent pixel element. The organic electroluminescent device 100 includes a first substrate 102. The organic electroluminescent device 100 further includes a second substrate 110 disposed opposite to the first substrate 102, wherein the first substrate 102 is separated from the second substrate 110 by an opaque frit sealing layer 112. The second substrate 110 can be a transparent substrate, such as a glass substrate, transparent plastic substrate, or transparent ceramic substrate. The second substrate 110 has an inside surface 103, wherein the inside surface 101 of the first substrate 102 is opposite to the inside surface 103 of the second substrate 110. A color filter layer 120 is disposed on the inside surface 103 of the second substrate 110, wherein the color filter layer 120 can include a red color filter layer, blue color filter layer, and green color filter layer respectively corresponding to the organic electroluminescent pixel elements 104, making the organic electroluminescent device 100 achieve full-color display.

Moreover, according to another embodiment of the present invention, the color filter layer 120 can further include a red color filter layer, a blue color filter layer, a green color filter layer, and a black matrix layer, in order to improve the contrast.

In the embodiment of FIG. 2, the opaque frit sealing layer 112 is used to encapsulate the first substrate 102 and the second substrate 110. The method for forming the opaque frit sealing layer 112 includes providing a frit material and subjecting the frit material to a laser curing process, wherein the frit material can include a glass powder, and a light absorbed particle. Since the ambient light can be absorbed by the opaque frit sealing layer 112 (serving as a light-absorbing layer), the performance of the organic electroluminescent device 100 would not be degraded by the ambient light. The glass powder can include $SiO_2$ and further include $K_2O$, $Sb_2O_3$, $ZnO$, $P_2O_5$, $V_2O_5$, $TiO_2$, $B_2O_3$, $WO_3$, $Fe_2O_3$, $Nd_2O_3$, $La_2O_3$, $Ce_2O_4$, $Pr_6O_{11}$, $Er_2O_3$, $CeO_2$, or combinations thereof. The glass powder is disclosed in detail in U.S. patent Ser. No. 10/823,331. The light absorbed particle can be black pigment particles or metallic particles, such as carbon clack, graphite, Fe, Cu, V, or Mo. The frit material can further include an adhesive agent (such as an organic compound) for increasing the viscosity of the frit material. For example, the frit material can be coated on the second substrate 110 via screen printing.

Further, it should be noted that the opaque frit sealing layer 112 of the organic electroluminescent device 100 is separated from the organic electroluminescent pixels array 108 by a dummy region 118. Please refer to FIG. 2. The dummy region 118 has a specific width W apart from the organic electroluminescent pixels array in order to prevent the organic electroluminescent pixels array from damage by the heat generated during a laser curing process of the opaque frit sealing layer 112. Herein, the width W can be between 0.05~0.5 µm, such as 0.1-0.3 µm.

Figure 4:
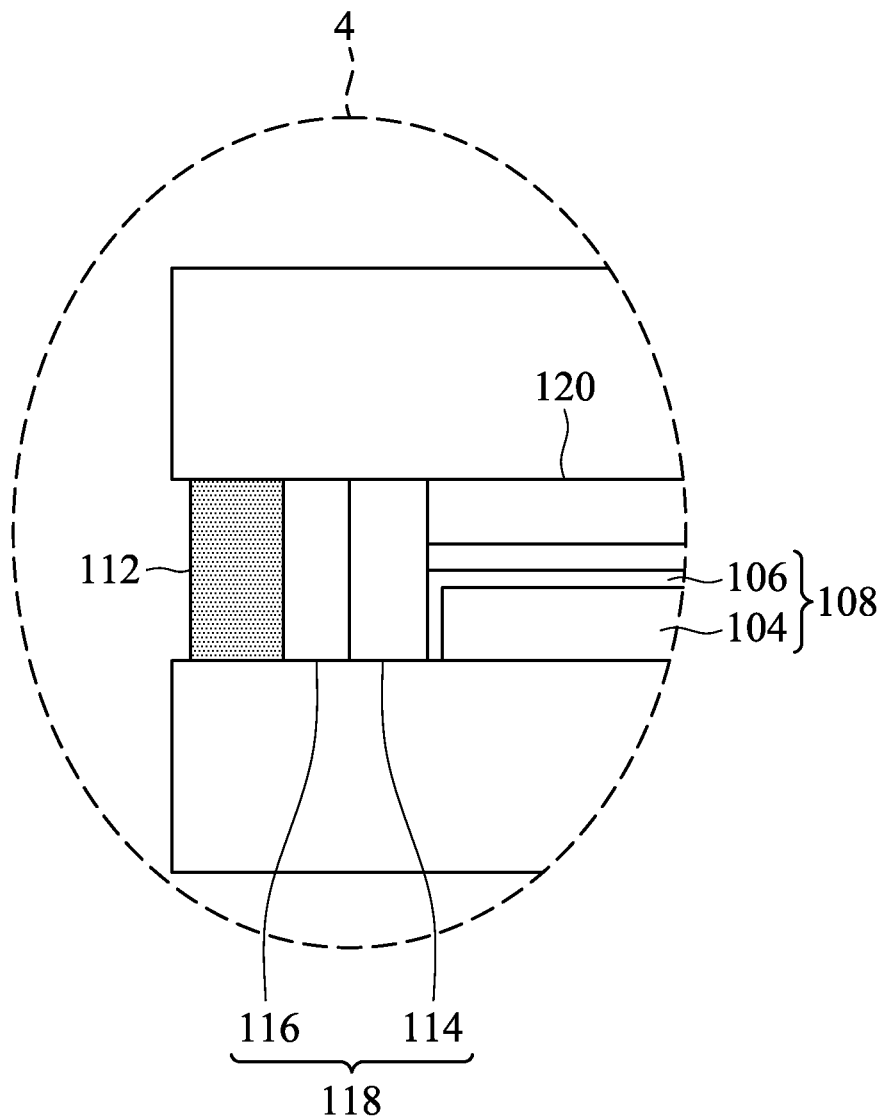
FIG. 4 is a close-up diagram of region 4 of the organic electroluminescent device shown in FIG. 3.

In comparison with the prior art, the present invention employs a black matrix material 114, a frit sealing layer 116, or combinations thereof for filling the dummy region 118. For example, in the embodiment of FIG. 3, the dummy region 118 is filled with the black matrix material 114, and the frit sealing layer 116. Please refer to FIG. 4 (a schematic close-up diagram of region 4 of FIG. 3), wherein the planarization layer 106 of the organic electroluminescent pixels array 108 is adjacent to the dummy region 118. Particularly, the frit sealing layer 116 is formed by the same frit material which is used to form the opaque frit sealing layer 112. The method for forming the frit sealing layer 116 and the opaque frit sealing layer 112 includes the following steps: first, a layer of frit material is formed; next, the layer of frit material is subjected to a baking process; next, a part of frit material (positioned adjacent to the boundary of the first substrate 102 and second substrate 110, away from the organic electroluminescent pixels array 108) is cured by a laser curing process, forming the opaque frit sealing layer 112, wherein the un-cured frit material is defined as the frit sealing layer 116. Namely, the opaque frit sealing layer 112 and frit sealing layer 116 are formed by the same material, but the difference therebetween is that the frit material for forming the opaque frit sealing layer 112 is further cured by the laser curing process, and the frit material for forming the sealing layer 116 is not. Although the frit sealing layer 116 is not subjected to the laser curing process, the frit sealing layer 116 can also serve as a light absorbing layer since the frit sealing layer 116 includes the light absorbed particle. As show in FIG. 4, the black matrix material 114 and the frit sealing layer 116 are both perpendicular to the first substrate 102.

Accordingly, since the dummy region 118 is filled with the black matrix material 114, the frit sealing layer 116, or a combination thereof, when the ambient light enters into the dummy region 118, the ambient light would be adsorbed by the black matrix material 114 and/or the frit sealing layer 116, rather than be reflected by the substrate to degrade the performance of the organic electroluminescent device 100. Accordingly, the organic electroluminescent device 100 of the present invention eliminates the polarizing film additionally disposed on an outside surface of the second substrate, thus saving one process in comparison with prior arts.

Figure 5:
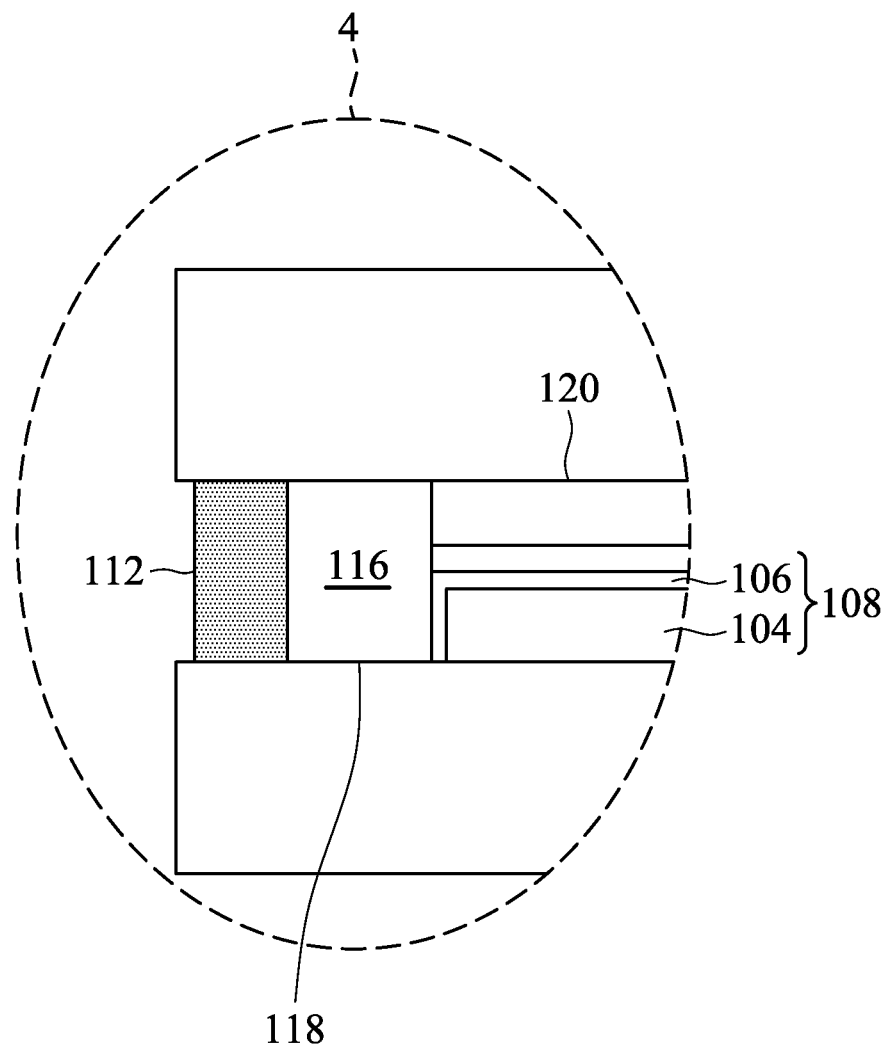
FIGS. 5-7 show a series of close-up diagrams of the organic electroluminescent devices showing the constitution of the dummy region.
Figure 6:
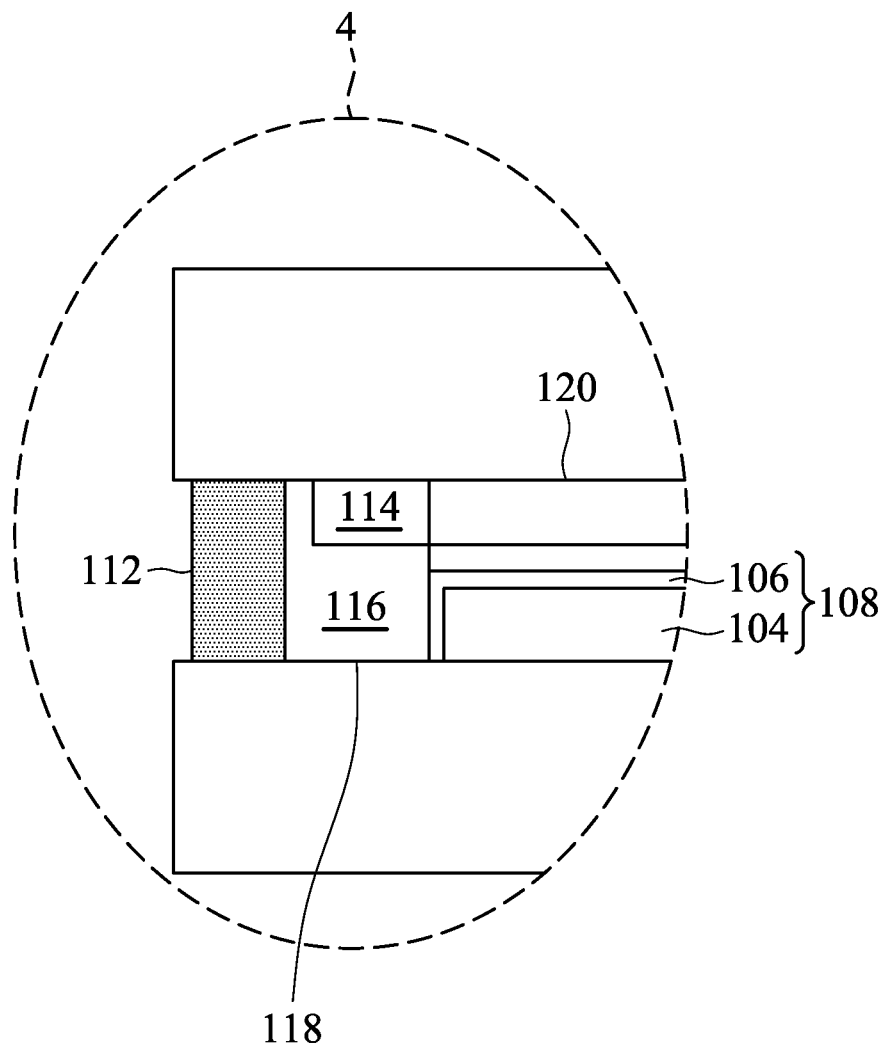

For another embodiment of the present invention, please refer to FIG. 5, wherein the dummy region 118 can be filled with the frit sealing layer 116 merely. Further, please refer to FIG. 6, wherein the black matrix material 114 can be a solid layer and directly formed on the inside surface 103 of the second substrate 110, and the frit sealing layer 116 can be formed below the black matrix material 114. As show in FIG. 6, the black matrix material 114 and the frit sealing layer 116 are both parallel with the first substrate 102.

Figure 7:
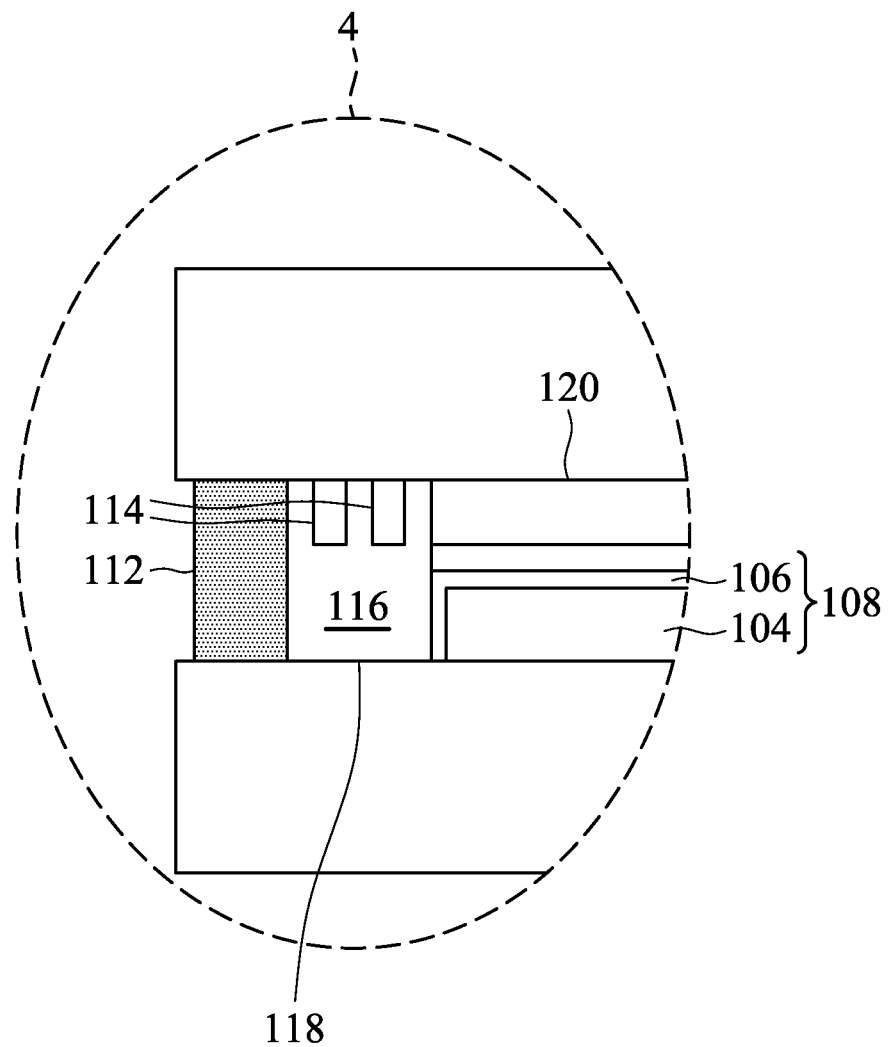

For some embodiments of the present invention, please refer to FIG. 7, wherein the dummy region 118 is filled with the black matrix material 114 and the frit sealing layer 116.

The black matrix material 114 can be point-shaped, bar-shaped, or net-shaped structure, and the frit sealing layer is filled into the vacant space 117 or meshes of the black matrix material 114 with point-shaped, bar-shaped, or net-shaped structure.

Due to the vacant space 117 or meshes of the black matrix material 114 with point-shaped, bar-shaped, or net-shaped structure, the frit sealing layer 116 may be further cured through the vacant space 117 or meshes. The black matrix material 114 can be ellipse-shaped, triangle-shaped, rhombus-shaped, square-shaped, rectangle-shaped, pentagon-shaped, hexagon-shaped, or combinations thereof, when the black matrix material 114 has a point-shaped structure.

Figure 8:
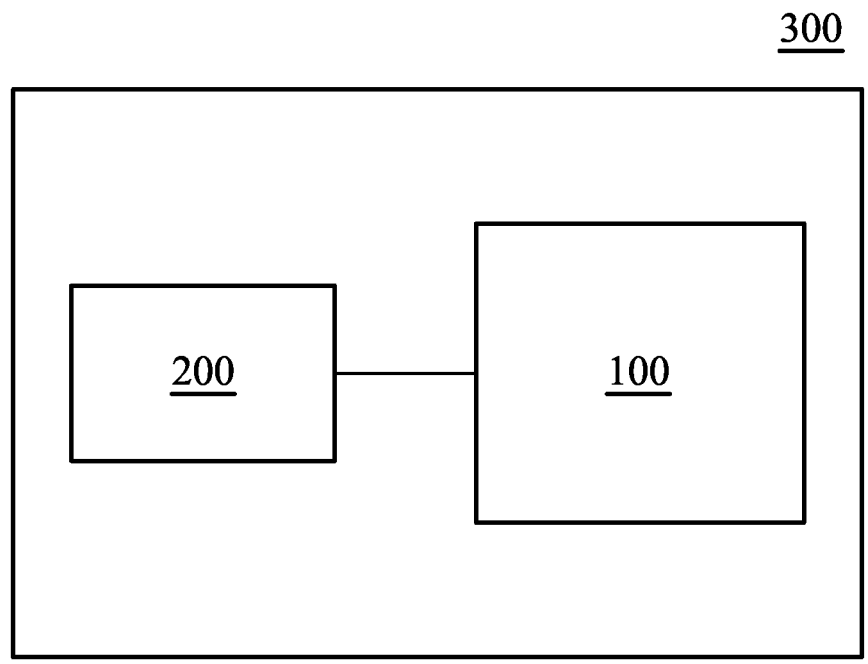
FIG. 8 schematically shows an image display system including the organic electroluminescent devices of the present invention.

Referring to FIG. 8, an image display system 300 for displaying images including the organic electroluminescent device 100 according to an embodiment of the invention is shown. The image display system 300 can be a electric device such as notebook computer, mobile phone, digital camera, personal data assistant (PDA), desktop computer, television, car display, or portable DVD player. The organic electroluminescent device 100 of the image display system 300 can be further coupled to an input unit 200. The input unit 200 is operative to provide input to the organic electroluminescent device 100, such that the organic electroluminescent device 100 displays images.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   an organic electroluminescent device, comprising:
   a first substrate with an inside surface;
   an organic electroluminescent pixels array disposed on the inside surface of the first substrate;
   a second substrate with an inside surface, wherein an inside surface of the second substrate is opposite to the inside surface of the first substrate;
   a color filter layer disposed on the inside surface of the second substrate; and
   an opaque frit sealing layer disposed between the first substrate and the second substrate for sealing the first substrate and the second substrate, wherein the opaque frit sealing layer is separated from the organic electroluminescent pixels array by a dummy region and is encapsulating the organic electroluminescent pixel array between the first substrate and second substrate, and wherein the dummy region is filled up with a black matrix material and a frit sealing layer, wherein the black matrix material is directly on an inside surface of the second substrate, and at least part of the frit sealing layer is below the black matrix material.

2. The image display system as claimed in claim 1, wherein the black matrix material and the frit sealing layer are both parallel with the first substrate.

3. The image display system as claimed in claim 1, wherein the black matrix material has a point-shaped, bar-shaped, or net-shaped structure.

4. The image display system as claimed in claim 1, wherein the dummy region is in direct contact with the opaque frit sealing layer.

5. The image display system as claimed in claim 4, wherein the black matrix material has a point-shaped, bar-shaped, or net-shaped structure, and the frit sealing layer is filled into a vacant space of the point-shaped, bar-shaped, or net-shaped structure.

6. The image display system as claimed in claim 1, wherein the second substrate is a glass substrate, transparent plastic substrate, or transparent ceramic substrate.

7. The image display system as claimed in claim 1, wherein the organic electroluminescent pixels array comprises a plurality of organic electroluminescent pixel elements, and a planarization layer covers the organic electroluminescent pixel elements.

8. The image display system as claimed in claim 7, wherein the organic electroluminescent pixels array is separated from the dummy region by the planarization layer.

9. The image display system as claimed in claim 1, wherein the dummy region has a width of between 0.05~0.5 µm.

10. The image display system as claimed in claim 1, wherein the dummy region has a width of between 0.1~0.3 µm.

11. The image display system as claimed in claim 1, wherein the color filter layer comprises a red color filter layer, blue color filter layer, and green color filter layer.

12. The image display system as claimed in claim 1, wherein the color filter layer comprises a red color filter layer, blue color filter layer, green color filter layer, and black matrix layer.

13. The image display system as claimed in claim 1, wherein the frit sealing layer is made of a frit material, and the frit material comprises a glass powder, and a light absorbed particle.

14. The image display system as claimed in claim 13, wherein the glass powder comprises silicon oxide.

15. The image display system as claimed in claim 14, wherein the glass powder further comprises $K_2O$, $Sb_2O_3$, $ZnO$, $P_2O_5$, $V_2O_5$, $TiO_2$, $B_2O_3$, $WO_3$, $Fe_2O_3$, $Nd_2O_3$, $La_2O_3$, $Ce_2O4$, $Pr_6O_{11}$, $Er_2O_3$, $CeO_2$, or combinations thereof.

16. The image display system as claimed in claim 13, wherein the light absorbed particle comprises a black pigment particle or a metallic particle.

17. The image display system as claimed in claim 13, wherein the opaque frit sealing layer comprises a product formed by subjecting the frit material to a laser curing process.

18. The image display system as claimed in claim 1, wherein the dummy region comprises the black matrix material, and the black matrix material is a continuous layer.

19. The image display system as claimed in claim 1, wherein the black matrix material is ellipse-shaped, triangle-shaped, rhombus-shaped, square-shaped, rectangle-shaped, pentagon-shaped, hexagon-shaped, or combinations thereof.

20. The image display system as claimed in claim 1, further comprising:
   an electric device, wherein the electric device comprises:
   the organic electroluminescent device; and
   an input unit coupled to the organic electroluminescent device and operative to provide input to the organic electroluminescent device such that the organic electroluminescent device displays images.

* * * * *